United States Patent
Kinoshita et al.

(10) Patent No.: US 6,271,087 B1
(45) Date of Patent: Aug. 7, 2001

(54) METHOD FOR FORMING SELF-ALIGNED CONTACTS AND LOCAL INTERCONNECTS USING SELF-ALIGNED LOCAL INTERCONNECTS

(75) Inventors: Hiroyuki Kinoshita, Sunnyvale; YongZhong Hu, San Jose; Yu Sun, Saratoga; Fei Wang, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/685,968

(22) Filed: Oct. 10, 2000

(51) Int. Cl.[7] .................. H01L 21/336; H01L 21/3205
(52) U.S. Cl. ...................... 438/258; 438/269; 438/592
(58) Field of Search .......................... 438/253–258, 438/264, 592, 618, 396, 637, 737, 629; 257/400, 324, 752, 776

(56) References Cited

U.S. PATENT DOCUMENTS

| | | | |
|---|---|---|---|
| Re. 36,644 | * 4/2000 | Dennison | 438/396 |
| 6,037,216 | * 3/2000 | Liu et al. | 438/253 |
| 6,074,912 | * 6/2000 | Lin et al. | 438/253 |
| 6,080,619 | * 6/2000 | Chien et al. | 438/253 |
| 6,083,828 | * 7/2000 | Lin et al. | 438/639 |
| 6,124,165 | * 9/2000 | Lien | 438/253 |
| 6,127,260 | * 10/2000 | Huang | 438/629 |
| 6,136,642 | * 10/2000 | Tan et al. | 438/253 |
| 6,143,602 | * 11/2000 | Jang | 438/253 |
| 6,150,213 | * 11/2000 | Luo et al. | 438/253 |
| 6,159,843 | * 12/2000 | Lin | 438/631 |
| 6,168,987 | * 1/2001 | Jeng et al. | 438/253 |

* cited by examiner

Primary Examiner—Michael Lebentritt
(74) Attorney, Agent, or Firm—Mikio Ishimaru

(57) ABSTRACT

A method of manufacturing a semiconductor device is provided in which multi-layer structures are formed on a semiconductor substrate to form core and peripheral regions. Sidewall spacers are formed around the multi-layer structures and source and drain regions are implanted adjacent the sidewall spacers and a stop layer is deposited over the semiconductor substrate after which a dielectric layer is deposited over the stop layer. A first photoresist contact mask is deposited, processed, and used to etch core contact and peripheral local interconnect openings. The first photoresist contact mask is removed. A second photoresist contact mask is deposited, processed, and used to etch the multi-layer structures to form local interconnect openings. The second photoresist contact mask is removed. A conductive material is deposited over the dielectric layer and in the core and peripheral contact openings and is chemical mechanical planarized to remove the conductive material over the dielectric layer so the conductive material is left isolated in the core contact and peripheral local interconnect openings with core contacts to the source/drain regions and peripheral local interconnect contacts to the multi-layer structures and the source/drain regions.

18 Claims, 8 Drawing Sheets

METHOD FOR FORMING SELF-ALIGNED CONTACTS AND LOCAL INTERCONNECTS USING SELF-ALIGNED LOCAL INTERCONNECTS

CROSS-REFERENCE TO RELATED APPLICATIONS

The present application contains subject matter related to a concurrently filed U.S. Patent Application by YongZhong Hu, Fei Wang, Wenge Yang, Yu Sun, and Hiroyuki Kinoshita entitled "METHOD FOR FORMING SELF-ALIGNED CONTACTS AND LOCAL INTERCONNECTS FOR SALICIDED GATES USING A SECONDARY SPACER" and identified by docket number D973.

The present application also contains subject matter related to a concurrently filed U.S. Patent Application by YongZhong Hu, Fei Wang, Wenge Yang, Yu Sun, and Ramkumar Sabramanian entitled "METHOD FOR FORMING SELF-ALIGNED CONTACTS AND LOCAL INTER-CONNECT USING A LOCAL INTERCONNECT SELF-ALIGNED GATE" and identified by docket number D974.

The present application further contains subject matter related to the following copending U.S. Patent Applications: 1) by Fei Wang, Yu Sun, Angela T. Hui, Mark S. Chang, Mark T. Ramsbey, Chi Chang, and Ramkumar Subramanian entitled "REDUCED SIZE SEMICONDUCTOR DEVICE AND MANUFACTURING METHOD THEREFOR" and identified by docket number D967 and Ser. No. 09/502,628; 2) by Fei Wang, Ramkumar Subramanian, and Yu Sun entitled "METHOD FOR FORMING SELF-ALIGNED CONTACTS USING CONSUMABLE SPACERS" and identified by docket number D969 and Ser. No. 09/502,153; 3) by Hiroyuki Kinoshita, Yu Sun, and Fei Wang entitled "METHOD FOR FORMING DOUBLE OXIDE/NITRIDE SPACERS" and identified by docket number D975 and Ser. No. 09/502,375; and 4) by Fei Wang, Hiroyuki Kinoshita, Kashmir Sahota, Yu Sun, and Wenge Yang entitled "METHOD FOR FORMING SELF-ALIGNED CONTACTS USING A LINER OXIDE LAYER" and identified by docket number D977 and Ser. No. 09/502,163.

The related applications are assigned to Advanced Micro Devices, Inc.

1. Technical Field

The present invention relates generally to semiconductors and more specifically to an improved fabrication process for making semiconductor memory devices.

2. Background Art

Flash electrically erasable programmable read only memory (EEPROM) is a class of nonvolatile memory devices that are programmed by hot electron injection and erased by Fowler-Nordheim tunneling.

Each memory cell is formed on a semiconductor substrate (i.e., a silicon die or chip), having a heavily doped drain region and a source region embedded therein. The source region further contains a lightly doped deeply diffused region and a more heavily doped shallow diffused region embedded into the substrate. A channel region separates the drain region and the source region. The memory cell further includes a multi-layer structure, commonly referred to as a "stacked gate" structure or word line. The multi-layer stacked gate structure typically includes: a thin gate dielectric or tunnel oxide layer formed on the surface of substrate overlying the channel region; a polysilicon floating gate overlying the tunnel oxide; an interpoly dielectric layer overlying the floating gate; and a polysilicon control gate overlying the interpoly dielectric layer. Additional layers, such as a silicide layer (deposited on the control gate), a poly cap layer (deposited on the gate silicide layer), and a silicon oxynitride layer (deposited on the poly cap layer) may be formed over the control gate. A plurality of Flash EEPROM cells may be formed on a single substrate.

A Flash EEPROM also includes peripheral portions, which typically include input/output circuitry for selectively addressing individual memory cells.

The process of forming Flash EEPROM cells is well known and widely practiced throughout the semiconductor industry. After the formation of the memory cells, electrical connections, commonly known as "contacts", must be made to connect the stack gated structure, the source region and the drain regions to other parts of the chip. The contact process starts with the formation of sidewall spacers around the multi-layer stacked gate structures of each memory cell. A silicidation process is applied to the active region and poly-gate. An etch stop or liner layer, typically a nitride material such as silicon nitride, is then formed over the entire substrate, including the multi-layer stacked gate structure, using conventional techniques, such as chemical vapor deposition (CVD). A dielectric layer, generally of oxide such as such as boro-phospho-tetra-ethyl-ortho silicate (BPTEOS) or borophosphosilicate glass (BPSG), is then deposited over the etch stop layer. A chemical-mechanical planarization (CMP) process is applied to the wafer and wafer-scale planarization is achieved. A layer of photoresist is then placed over the dielectric layer and is photolithographically processed to form the pattern of contact openings. An anisotropic etch is then used to etch out portions of the dielectric layer to form source and drain contact openings in the oxide layer. The contact openings stop at the source and drain regions in the substrate. The photoresist is then stripped, and a conductive material, such as tungsten, is deposited over the dielectric layer and fills the source and drain contact openings to form conductive contacts. The substrate is then subjected to a CMP process, which removes the conductive material above the dielectric layer to form the conductive contacts through a contact CMP process.

For miniaturization, it is desirable to have adjacent word lines as closely together as possible. However, in order to accommodate electrical contacts in the active regions (source and drain) between the stacked gates and avoid electrical shorts between stacked gates and core active areas, wide spacing (separation) between word lines is required. This process significantly increases semiconductor memory core cell size and therefore adversely impacts semiconductor device and memory densities. Moreover, this problem is becoming more critical as separation between adjacent stacked gate structures diminishes with semiconductor technology feature size scaling down to sub-quarter micron level and below.

The above becomes worse at smaller geometries because the core region must be treated differently from the peripheral region. In the core region, it is necessary that the gate contact and source/drain contacts be isolated. In the peripheral region, it is necessary that the gate contacts and source/drain contacts be in contact and form local interconnect to increase packing density and device performance.

A solution, which would allow further miniaturization of memory device without adversely affecting device performance has long been sought, but has eluded those skilled in the art. As the demand for higher performance devices and miniaturization continues at a rapid pace in the field of semiconductor, it is becoming more pressing that a solution be found.

DISCLOSURE OF THE INVENTION

The present invention provides a method for shrinking a semiconductor device by processing the peripheral region to form contacts separately in a decoupled process from the core region so the multi-layer stacked gate structures can be positioned closer together.

The present invention provides a method of manufacturing a semiconductor device in which multi-layer structures are formed on a semiconductor substrate to form core and peripheral regions. Sidewall spacers are formed around the multi-layer structures and source and drain regions are implanted adjacent the sidewall spacers and a salicidation process is applied to form source/drain and gate contacts. A cap layer is deposited over the gate contact and a stop layer is deposited over the semiconductor substrate after which a dielectric layer is deposited over the stop layer. A CMP process is applied to the wafer and wafer-scale planarization is achieved. A photoresist contact mask is deposited, processed, and used to form core self-aligned contact and peripheral self-aligned local interconnect openings over the core and peripheral regions, respectively, so as to expose the multi-layer structures in addition to the source and drain regions. A second photoresist contact mask is deposited, processed, and used to form peripheral self-aligned local interconnect gate openings over the peripheral region while covering the core region. A conductive material is deposited over the dielectric layer and in the core contact and peripheral local interconnect openings and is chemical-mechanical planarized to remove the conductive material over the dielectric layer so the conductive material is left isolated in the core and peripheral contact openings with core contacts to the source/drain regions and peripheral contacts to the multi-layer structures and the source/drain regions.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
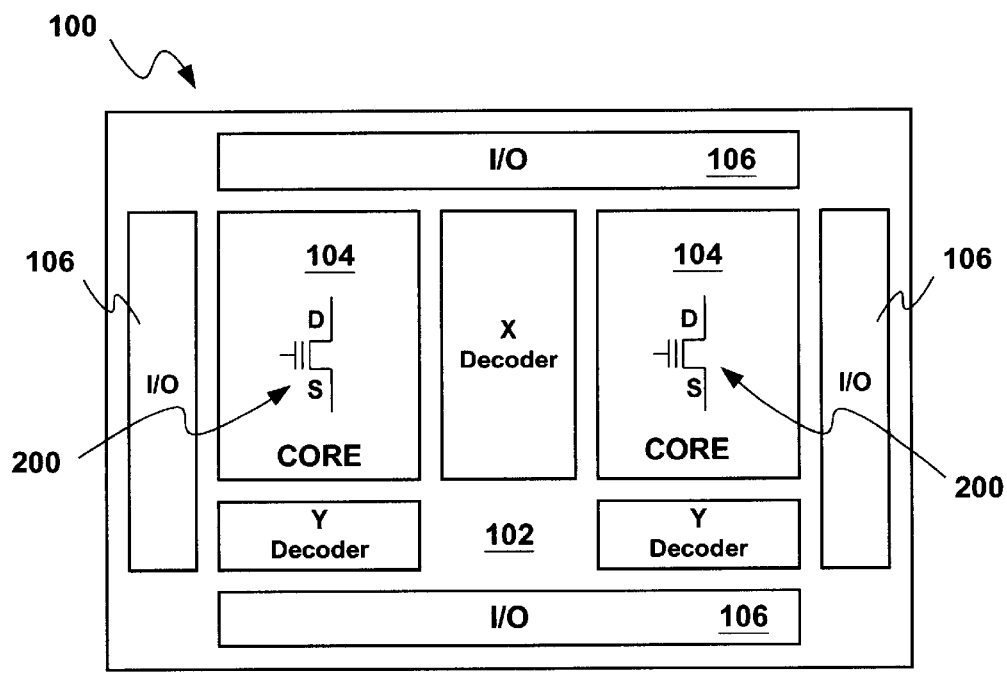
FIG. 1 (PRIOR ART) is a plan view of a conventional memory device.

Referring now to FIG. 1 (PRIOR ART), therein is shown a plan view of a conventional memory device, a Flash EEPROM 100 which commonly includes a semiconductor substrate 102 on which one or more high-density core regions and one or more low-density peripheral regions are formed. A high-density core region 104 typically includes one or more M×N array cores of individually addressable, substantially identical memory cells 200. A low-density peripheral region 106 typically include input/output (I/O) circuitry and circuitry for selectively addressing the individual cells. The selective addressing circuitry typically includes one or more x-decoders and y-decoders, cooperating with the I/O circuitry for connecting the source, gate, and drain region of selected addressed cells to predetermined voltages or impedances to effect designated operations on the cell, e.g., programming, reading and erasing, and deriving necessary voltages to effect such operations.

Figure 2A:
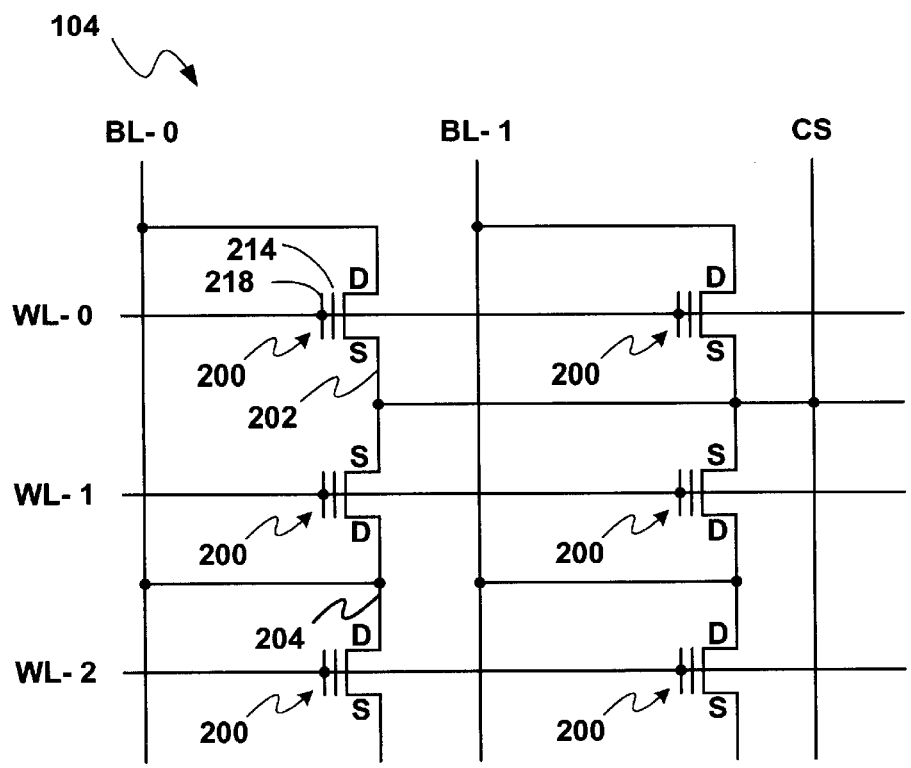
FIG. 2A (PRIOR ART) is a schematic diagram of a portion of a memory cell array.
Figure 2B:
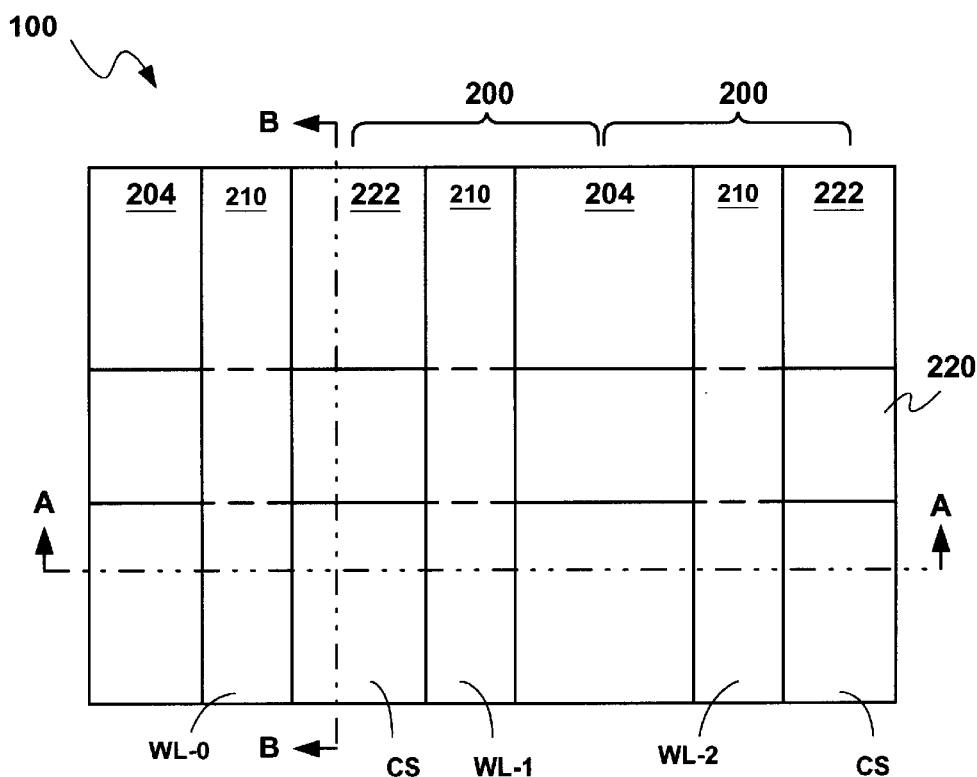
FIG. 2B (PRIOR ART) is a plan view of a portion of an intermediate state (partially complete) of a core regions.
Figure 2C:
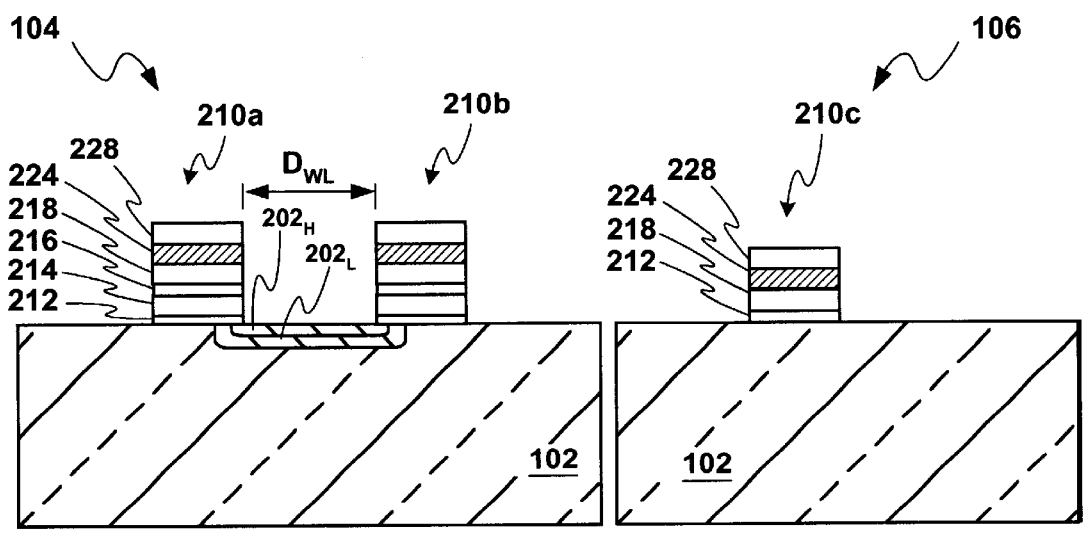
FIG. 2C (PRIOR ART) is a simplified cross section of FIG. 2B (PRIOR ART) along line A—A.

Referring now to FIG. 2A (PRIOR ART), therein is shown a schematic diagram of a portion of a memory cell array in which each cell 200 in the core region 104 typically comprises: a source region 202, a drain region 204 and a channel 206 (shown in FIG. 2C (PRIOR ART)) semiconductor regions.

Referring now to FIG. 2B (PRIOR ART), therein is shown a plan view of a portion of an intermediate state (partially complete) of a cell array in the core region 104.

Referring now to FIG. 2C (PRIOR ART), therein is shown a simplified cross-section of FIG. 2B (PRIOR ART) along line A—A. The source region 202, the drain region 204, and the channel 206 semiconductor regions are shown formed in semiconductor substrate 102 (or in an isolation well); and a multi-layer structure, commonly referred to as a "stacked gate" (word line) structure 210. For purposes of illustration, typical core multi-layer stacked gate structures 210a and 210b include: a thin gate dielectric layer 212 (commonly referred to as the "tunnel oxide") formed on the surface of semiconductor substrate 102 overlying channel 206; a floating gate 214 overlying the gate dielectric layer 212; an interpoly dielectric layer 216 overlying floating gate 214; a control gate 218 overlying interpoly dielectric layer 216; a gate silicide layer 224 deposited on the control gate 218; and a cap layer 228 (of a material such as silicon oxynitride) deposited on the gate silicide layer 224. The peripheral stacked gate structure 210c (or transistor gate) includes: the thin gate dielectric layer 212; the control gate 218; the gate silicide layer 224; and the cap layer 228. The cells 200 are arranged in a series of rows and columns.

In the completed array, the control gates 218 of the cells 200 in a row are formed integral to a common word line (WL) associated with the row. Columns of cells are arranged such that adjacent cells in a column share a common semiconductor region as a source region or drain region. The source region 202 of each cell in a column (excepting end cells) is formed in a common region with one of the adjacent cells, e.g., the preceding cell in the column. Likewise, the drain region of the cell is formed in a common region with the drain region 204 of the other adjacent cell, e.g., the next succeeding cell in the column (except end cells). The drain region of each cell in a column of cells is connected by a conductive bit line (BL) (FIG. 2A (PRIOR ART)), including an overlying layer of metal connected to each drain region 204 of the cells 200 within the column. Additionally, the source regions of each cell 200 in a row (and hence pairs of rows) are interconnected by a common source line CS (FIGS. 2A (PRIOR ART)) formed in the semiconductor substrate 102. Any particular cell 200 within the core region 104 can be individually addressed (programmed and read) by operating upon one word line and one bit line.

Typically, in forming an EEPROM 100, a pattern of field oxide regions 220 (FIG. 2B and 2D) is initially formed to provide electrical isolation between the respective devices of EEPROM 100. For example, the field oxide regions 220 are used to provide isolation between the core region 104 and the devices of peripheral region 106, as well as between the various columns of cells 200 within the core region 104. Field oxide regions are conventionally formed using a mask and selective growth process: a layer of thermal oxide ("barrier oxide"or "pad oxide") is grown or deposited over the surface of the semiconductor substrate 102; a mask, frequently composed of nitride, is deposited on the barrier oxide, and patterned to cover those regions of the semiconductor substrate 102 in which devices are to be formed (herein referred to as active regions); field oxide is grown in the exposed areas of the barrier oxide by, for example, the local oxidation of silicon (LOCOS); and the masking layer and barrier oxide are stripped to expose the underlying semiconductor substrate 102. In general, referring to FIG. 2B (PRIOR ART), within the core region 104, the selective growth process results in alternating parallel strips of field oxide regions 220 and exposed regions corresponding to the columns of cells 200 in the array.

Stacked gate word line structures 210 are then typically formed. For example, gate dielectric layer 212, suitably comprising a thin (e.g. approximately 100 angstroms) layer of oxide, is initially formed on the semiconductor substrate 102 by a suitable technique, such as, for example, thermally oxidizing the surface of the semiconductor substrate 102 or by depositing a suitable material on the semiconductor substrate 102. A layer of suitable conductive polysilicon (e.g., polycrystalline silicon), that will ultimately form the floating gates 214, is typically then formed on the gate dielectric layer 212. For example, conductive polysilicon may be deposited by any suitable technique, e.g., conventional chemical vapor deposition (CVD). The polysilicon layer is typically then masked and etched to remove strips overlying the field oxide regions 220, leaving isolated strips of polysilicon on top of the gate dielectric layer 212 overlying the substrate regions corresponding to the columns of cells 200 of the core region 104 (i.e. the regions in which source region, channel, and drain regions of cells in the column will be formed). A layer of suitable dielectric material, such as, e.g., an oxide-nitride-oxide (ONO) layer, that will ultimately form an interpoly dielectric layer 216 is typically then formed by a suitable technique. For example, where the interpoly dielectric layer 216 is ONO, it is suitably formed by growing a layer of oxide, depositing a layer of nitride, followed by growing another layer of oxide. The interpoly dielectric layer 216 layer, in the completed array, insulates control gates 218 from floating gates 214 in the individual cells and electrically isolates the adjacent columns of the floating gates 214 in the core region 104. Another layer of conductive polysilicon (e.g., polycrystalline silicon), that will ultimately form the control gates 218 (and the word lines WL connecting the control gates of the cells in the respective rows of the core region 104) is typically then deposited on the interpoly dielectric layer 216, by a suitable technique, such as, for example, by conventional CVD. Portions of the respective polysilicon and interpoly dielectric layers define the multilayer stacked gate structures 210 which include the gate dielectric layer 212, i.e., to form the floating gates 214, the interpoly dielectric layer 216, and the control gates 218 of the individual cells, and the word lines WL (portions of the interpoly dielectric layer 216 and control gate polysilicon layers, the field oxide regions 220, to connect the respective cells of the rows of the core array). This is typically effected by suitable masking and etching techniques.

When completed, this etch creates the respective, generally parallel, word line gate structures 210 separated by a distance $D_{WL}$, as shown in FIG. 2C (PRIOR ART).

Conventionally, the portions of the field oxide regions 220 and the gate dielectric layer 212 between every second pair of adjacent word lines 210 in the core region 104 (i.e., the regions, generally indicated as 222, where the source regions 202 are to be formed and the portions of the field oxide regions 220 disposed between source regions 202 of the corresponding cells of adjacent columns) are then typically removed, in preparation for formation of the common line CS (not shown)) connecting the source regions 202. This is typically effected using a conventional Self-Aligned Source (SAS) etch.

Figure 2D:
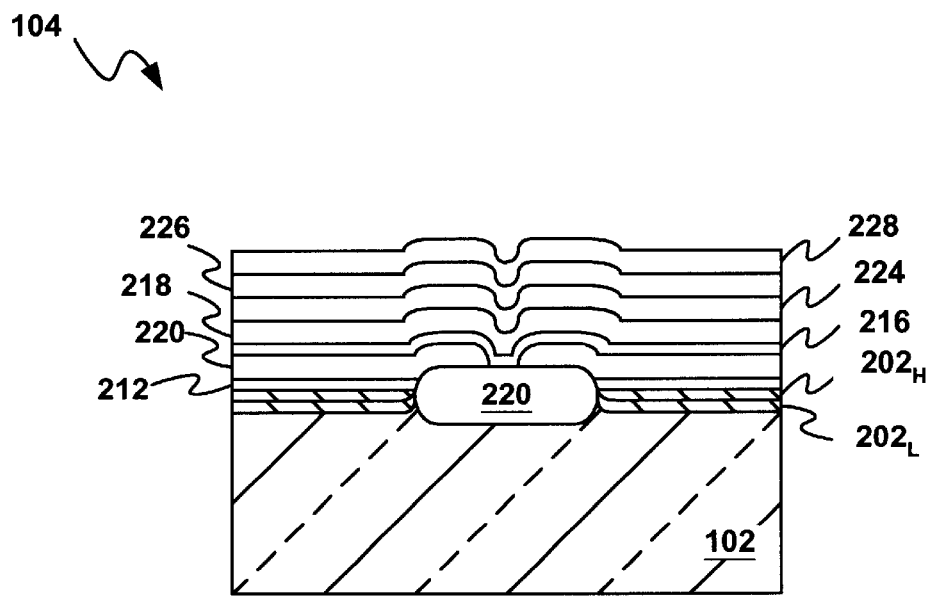
FIG. 2D (PRIOR ART) is a simplified cross section of FIG. 2B (PRIOR ART) along line B—B.

Referring now to FIG. 2D (PRIOR ART), therein are shown a simplified cross section of FIG. 2B (PRIOR ART) along line B—B for purposes of clarity.

In a conventional process, the source region 202,the common line CS, and the drain region 204 are then formed. The source region 202 and the common source line CS are typically formed by initially effecting a conventional double diffusion implant (DDI), with the SAS mask still in place. The DDI implants a first dopant (e.g. n-type, such as phosphorous) to form a deeply diffused, but lightly doped, N well $202_L$ establishing a graded source-channel junction as shown in FIG. 2D (PRIOR ART). The SAS mask is then removed. The DDI implant is typically driven deeper into the semiconductor substrate 102 by subjecting it to a thermal cycle at high temperature (e.g. 1050° C.). A shallow second implant, commonly referred to as a medium diffused drain (MDD) implant, is then performed (e.g., with arsenic) to create a more heavily doped, but shallower, n+ well $202_H$ embedded within deep N well $202_L$. The MDD implant also forms the drain region 204.

Figure 3A:
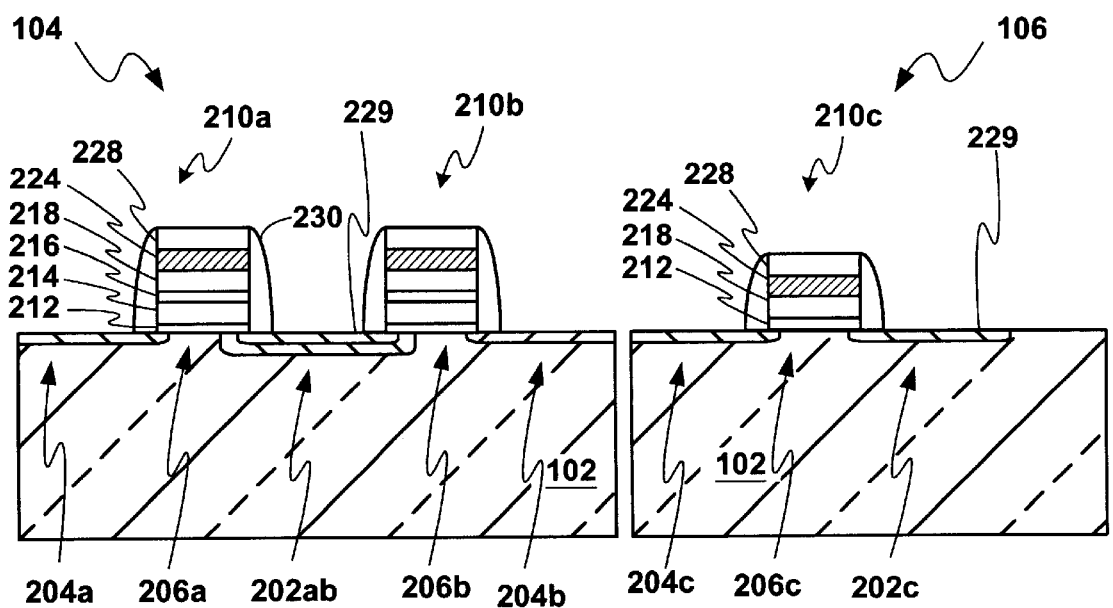
FIG. 3A (PRIOR ART) through 3E (PRIOR ART) illustrate the sequence of process steps of a conventional process for forming core and peripheral contacts.

Referring now to FIGS. 3A (PRIOR ART) through 3E (PRIOR ART), therein is shown the sequence of process steps of a conventional process for forming source/drain (S/D) contacts in the core region 104 and local interconnect (LI) contacts in the peripheral region 106.

FIG. 3A (PRIOR ART) shows both the core region 104 and the peripheral region 106. Sidewall spacers 230 have been formed around the multi-layer stacked gate structures 210a, 210b, and 210c formed on the semiconductor substrate 102, and source/drain silicide 229 has been formed. At this stage in the core region 104 are shown a channel region 206a separated by a drain region 204a and a common source region 202ab, and a channel region 206b separated by the common source region 202ab and a common drain region 202b. In the peripheral region 106 are shown source/drain 204c/202c separated by the channel 206c. It would be understood that the source and drain regions are interchangeably referred to as source/drain regions since their functions are not defined until they are connected in a circuit. The sidewall spacers 230 are typically formed of a nitride material using conventional deposition and etching techniques. Alternatively, the sidewall spacers 230 may be formed of an oxide material using chemical vapor deposition (CVD) followed by etching.

Figure 3B:
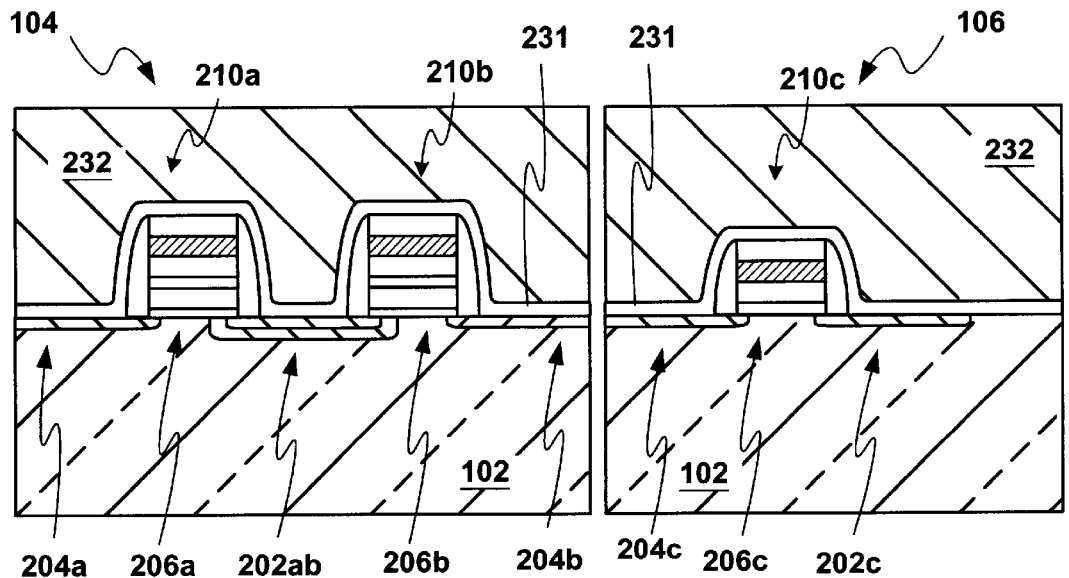

FIG. 3B (PRIOR ART) shows the deposition of an etch stop layer 231 over the semiconductor substrate 102, including over the multi-layer stacked gate structures 210a and 210b using conventional techniques, such as CVD. The etch stop layer 231 is typically formed of a nitride material, such silicon nitride, and is formed to a thickness typically in the range of approximately 30 to 120 nm. The etch stop layer 231 reduces the effective spacing in the horizontal direction between the multi-layer stacked gate structures 210a and 210b. A dielectric layer 232 is then deposited over the etch stop layer 231. The dielectric layer 232 may include various materials, such as boro-phospho-tetra-ethyl-ortho silicate (BPTEOS) or borophosphosilicate glass (BPSG), formed using plasma enhanced chemical vapor deposition (PECVD).

Figure 3C:
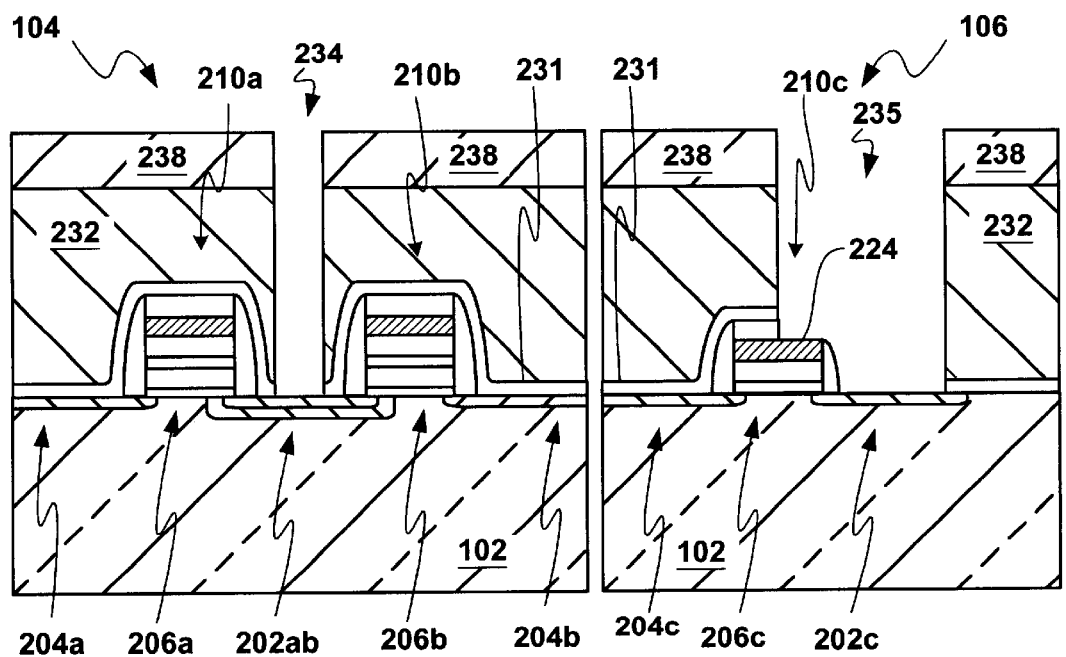

FIG. 3C (PRIOR ART) shows the formation of source/drain (S/D) contact opening 234 in the dielectric layer 232, through the etch stop layer 231, using a contact mask 238, to expose portions of the common source region 202ab in the core region 104. The S/D contact opening 234 is formed conventionally using a two-step etch process. The first etch process is a conventional anisotropic etch process, such as an oxide etch process, which stops at the etch stop layer 231. The second etch process is a conventional etch process, such as a nitride etch process, which removes portions of the etch stop layer 231 to expose portions of the common source region 202ab. Also shown is the formation of a local interconnect (LI) opening 235 in the dielectric layer 232, through the etch stop layer 231, using the contact mask 238, to expose portions of the source region 202c in the peripheral region 106. The LI contact opening 235 is formed conventionally during the two-step etch process above. The two-step etch process removes portions of the etch stop layer 231 and the silicon oxynitride layer 228 to expose portions of the gate silicide layer 224 as well as the source region 202c.

Figure 3D:
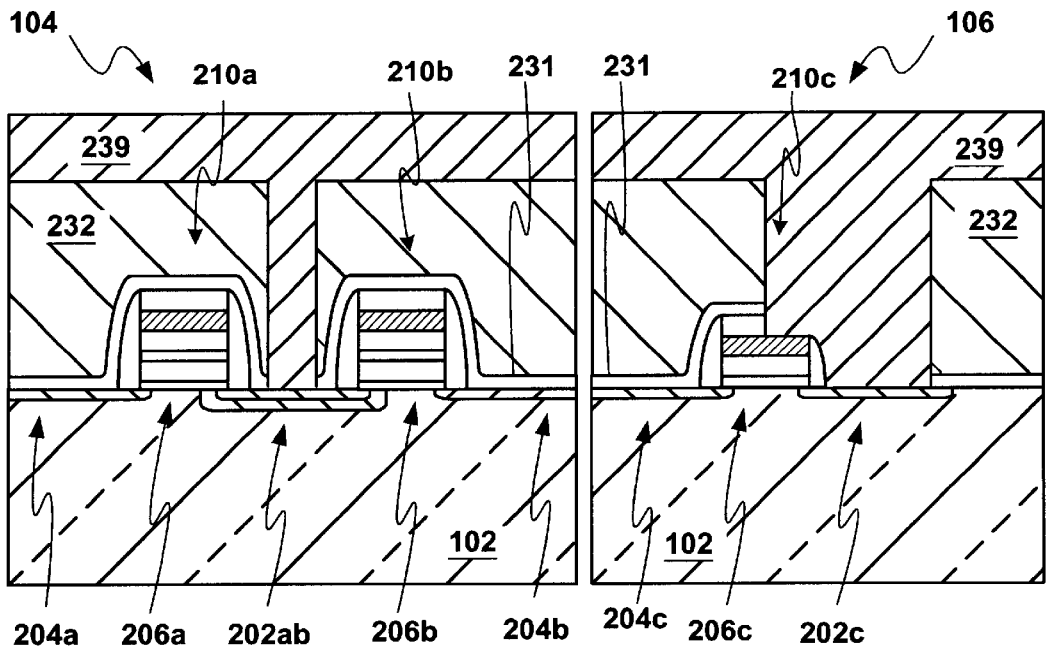

FIG. 3D (PRIOR ART) shows the removal of the contact mask 238 and the deposition of a conductive material to form a conductive layer 239 over the dielectric layer 232. The conductive material fills the contact opening 234 which will form a contact 240. The conductive material typically includes tungsten, aluminum, copper, gold, silver, etc., and may be formed using conventional metal deposition techniques, such as CVD and/or physical vapor deposition (PVD). A barrier material (not shown), such as titanium (Ti)/titanium nitride (TiN), is typically deposited to coat the walls of the contact opening 234 prior to the deposition of the conductive material to ensure good adhesion and electrical contact to the walls of the contact opening 234 and the underlying common source region 202ab.

Figure 3E:
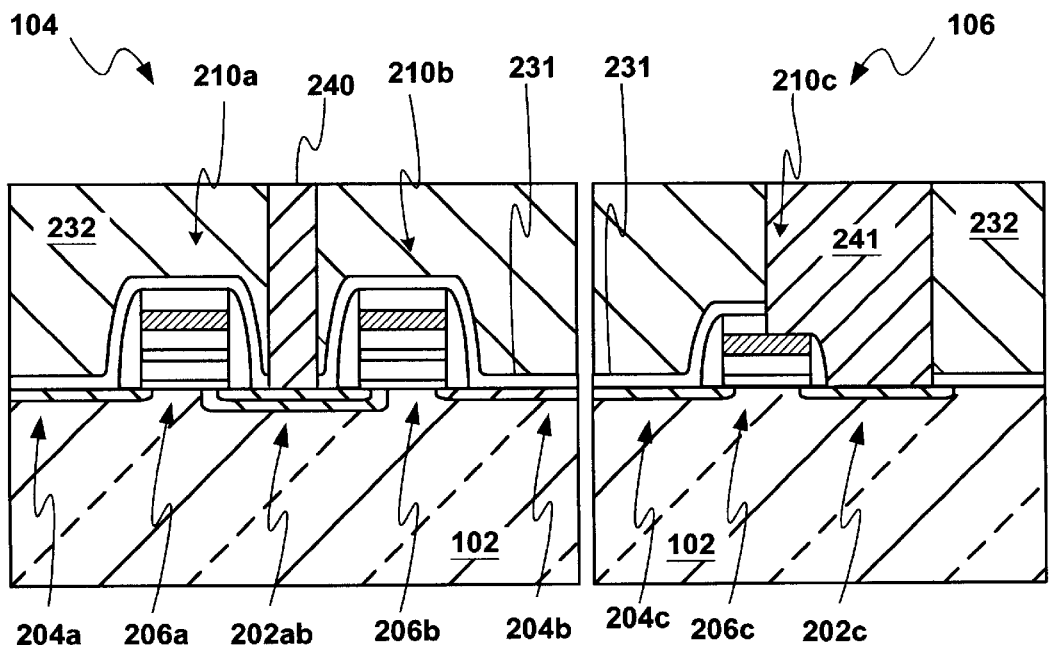

Referring now to FIG. 3E (PRIOR ART), therein is shown the removal of conductive material 239 above the dielectric layer 232 using, for example, CMP. This forms a core common source/drain contact 240 and a peripheral local interconnect(LI) 241.

As explained in the BACKGROUND ART, one of the problems associated with conventional processes is that the stacked gate structures have to have wide separation to guarantee good contacts in core active regions, which result in increased core cell size. The present invention provides a method for shrinking a semiconductor device by using self-aligned contacts so its stacked gate structures can be positioned closer together.

Referring now to FIGS. 4A through 4F, therein is shown the sequence of process steps for forming contacts in accordance with the present invention for fabricating EEPROM device on a semiconductor substrate. For convenience of illustration, like reference numerals are used in FIG. 4A through 4F to denote like elements already described in FIGS. 1 (PRIOR ART), 2A (PRIOR ART) through 2D (PRIOR ART), and 3A (PRIOR ART) through 3E (PRIOR ART).

Figure 4A:
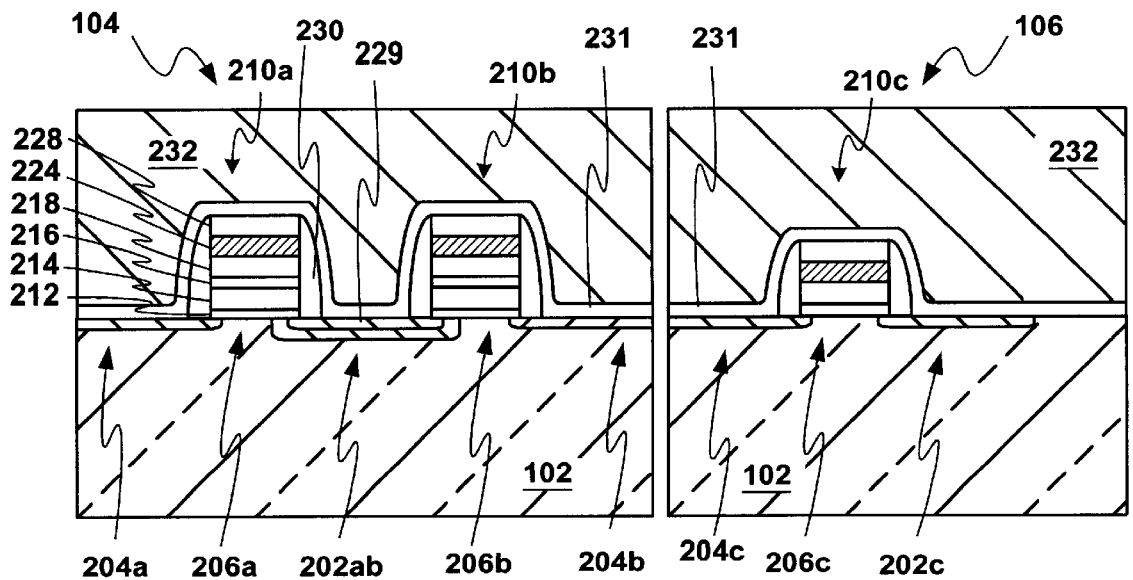
FIG. 4A through 4F illustrate the sequence of process steps of a process in accordance with the present invention for forming core and peripheral contacts.

FIG. 4A shows a partial, sectional view of an intermediate state (partially complete) of a portion of the core region 104 and a portion of the peripheral region 106 in which the present invention is applied. At this stage are shown multi-layer stacked gate structures 210a, 210b, and 210c formed on a semiconductor substrate 102. A common source region 202ab is formed between the two multi-layer stacked gate structures 210a and 210b. Drains 204a and 204b are formed on the semiconductor substrate 102 and are spaced apart from the common source region 202ab by channel regions 206a and 206b, respectively. In the peripheral region 106 are shown source/drain 204c/202c separated by the channel 206c under the stacked gate structure 210c. The S/D silicides 229 have been deposited and sidewall spacers 230 are formed around the multi-layer stacked gate structures 210a, 210b, and 210c. Again, the sidewall spacers 230 may be formed of an oxide or nitride material using conventional deposition and etching techniques.

In this embodiment, the sidewall spacers 230 are formed of a oxide material, such as silicon oxide. After the sidewall spacers 230 are formed, the etch stop layer 231 is formed over the semiconductor substrate 102, including the multi-layer stacked gate structures 210a and 210b, the sidewall spacers 230, the common source region 202ab, and the drain regions 204a and 204b c. The etch stop layer 231 is in contact with the multi-layer stacked gate structures 210a and 210b, the sidewall spacers 230, the common source region 202ab, and the drain regions 204a and 204bc. The etch stop layer 231 may be formed of a material such as silicon nitride or silicon dioxide. The etch stop layer 231 is preferably formed to a thickness of between about 30 nm to about 100 nm. The deposition of the etch stop layer 231 is followed by the deposition of a dielectric layer 232 over and in contact with the etch stop layer 231. The dielectric layer 232 may include an oxide which contains boron and/or phosphorus, such as boro-phospho-tetra-ethyl-ortho silicate (BPTEOS) or borophosphosilicate glass (BPSG), formed using plasma enhanced chemical vapor deposition (PECVD). The etch stop layer 231 serves as an auto-doped barrier for the dielectric layer 232 to prevent boron or phosphorus formed therein from auto-doping into common source region 202ab and drain regions 204a and 204bc which may cause degradation in device performance.

Each of the multi-layer stacked gate structures 210a or 210b includes the gate dielectric layer 212, such as an oxide layer, the floating gate 214 disposed on the gate dielectric layer 212, the interpoly (inter-gate) dielectric layer 216 disposed on the floating gate 214, the control gate 218 overlying the interpoly dielectric layer 216, the gate silicide layer 224 disposed on the control gate 218, the polysilicon (poly cap) layer 226 disposed on the gate silicide layer 224, and the silicon oxynitride layer 228 disposed on the poly cap layer 226.

Figure 4B:
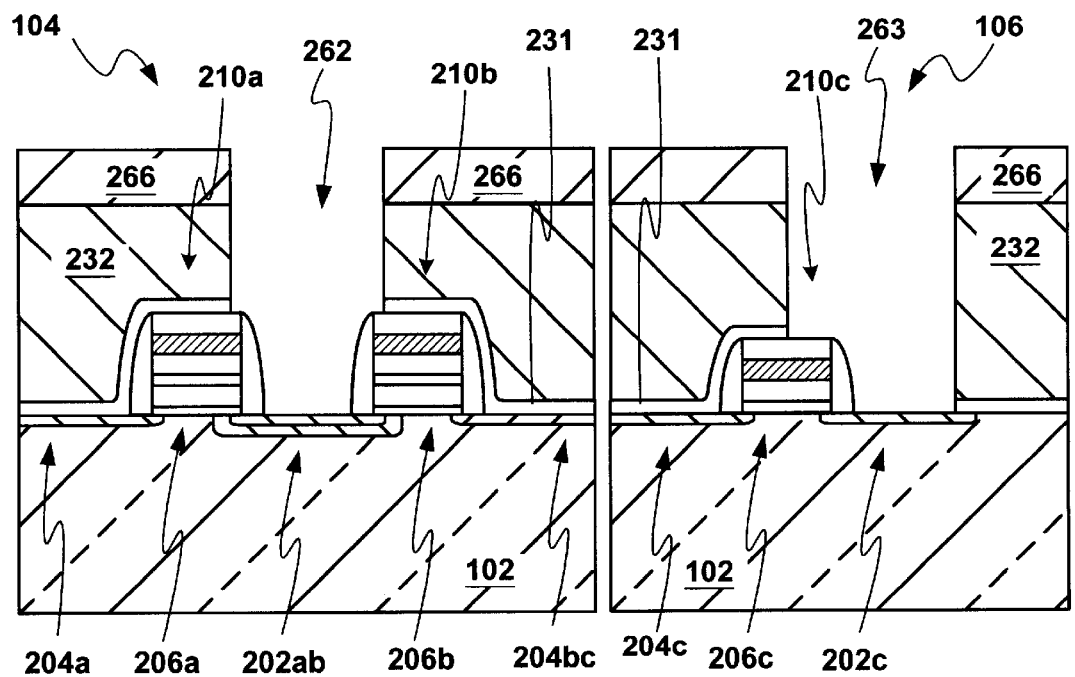

FIG. 4B shows the simultaneous formation of a S/D contact opening 262 and a LI contact opening 263 in the dielectric layer 232 using a self-aligned contact mask 266 to expose portions of the common source region 202ab in the core region 104 and the source/drain region 202c in the peripheral region 106. To minimize etching of the sidewall spacers 230 and the semiconductor substrate 102, the S/D contact opening 262 is formed using an anisotropic oxide etch process with a sufficiently high selectivity, i.e., etching of the dielectric layer 232 is performed with reactive ions at a rate faster than the etch rate of the sidewall spacers and the semiconductor substrate 102. A subsequent nitride etch is used to remove the etch stop layer 231 in the S/D contact opening 262 and the LI contact opening 263 located above the source/drain region 202c, on portions of the sidewall spacers 230 and on portions of the multi-layer stacked gate structures 210a, 210b, and 210c.

Figure 4C:
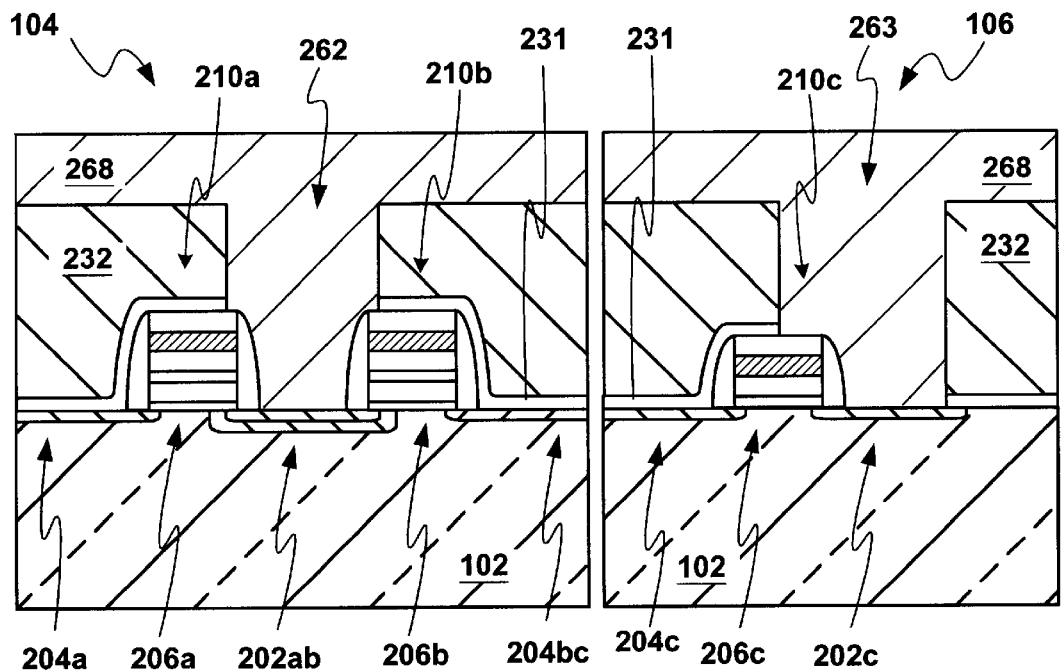

FIG. 4C shows the deposition of a photoresist, which fills the S/D contact opening 262 and the local interconnect (LI)

opening 263 in the dielectric layer 232 to form a second contact mask 268.

Figure 4D:
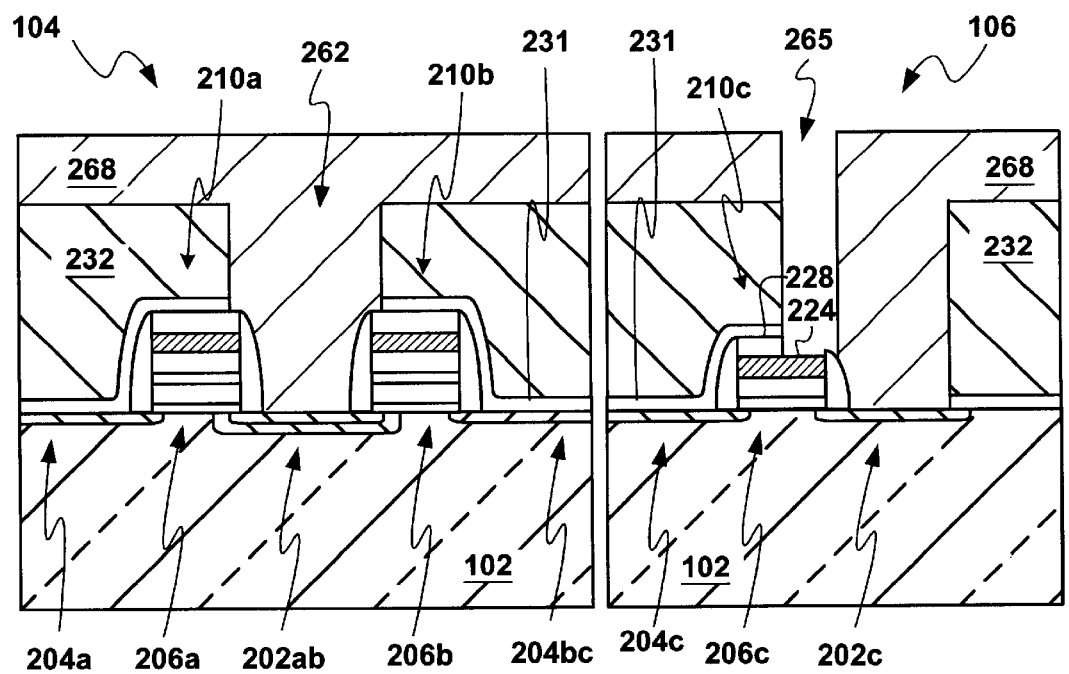

FIG. 4D shows the reopening of the LI contact opening 263 as a self-aligned local interconnect opening 265, which is formed after patterning and developing of the second contact mask 268 in the peripheral region 106 followed by anisotropic etching. The anisotropic etching process etches through the cap layer 228 of silicon oxynitride down to the gate silicide layer 224 of the multi-layer stacked gate structure 210c.

Figure 4E:
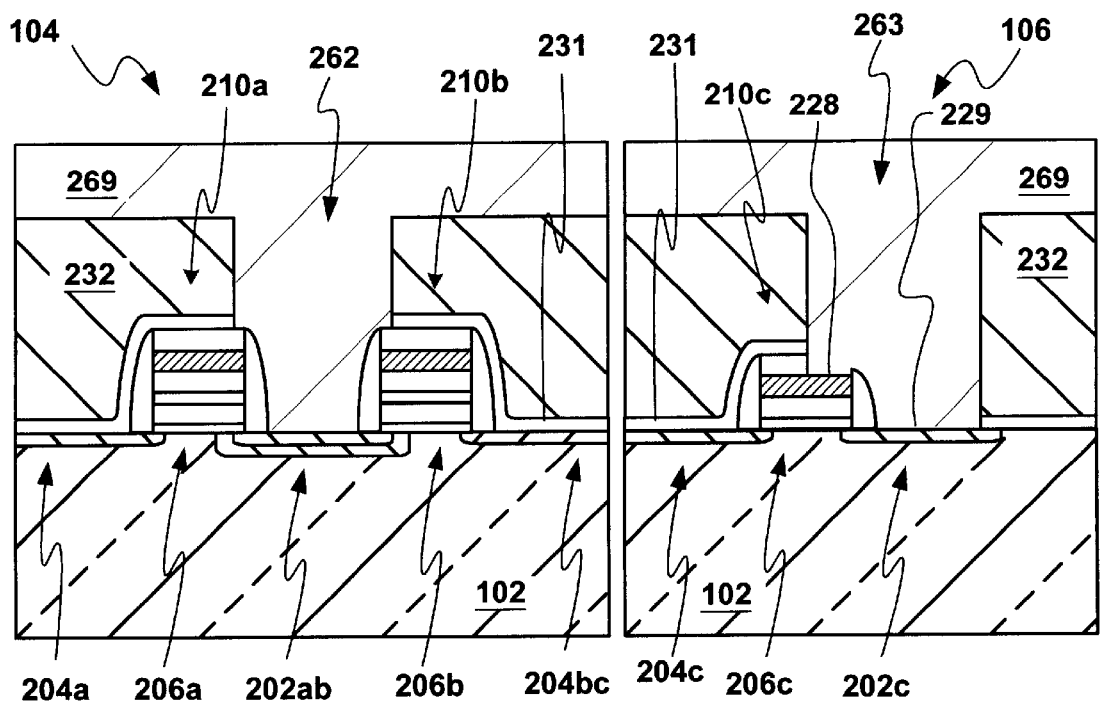

FIG. 4E shows the removal of the second contact mask 268 and the deposition of a conductive material to form a conductive layer 269 over the dielectric layer 232. The conductive material fills the S/D contact opening 262 and the self-aligned local interconnect opening 263. In this embodiment, the conductive material is tungsten and may be formed using conventional metal deposition techniques, such as CVD and/or physical vapor deposition (PVD). Other conductive materials can be used such as copper. A barrier material (not shown), such as titanium (Ti)/titanium nitride (TiN), is typically deposited to coat the walls of the contact opening 262 prior to the deposition of the conductive material to ensure good adhesion and electrical contact to the walls of the S/D contact opening 262, the LI contact opening 263, the gate silicide layer 224, and the S/D silicide 229.

Figure 4F:
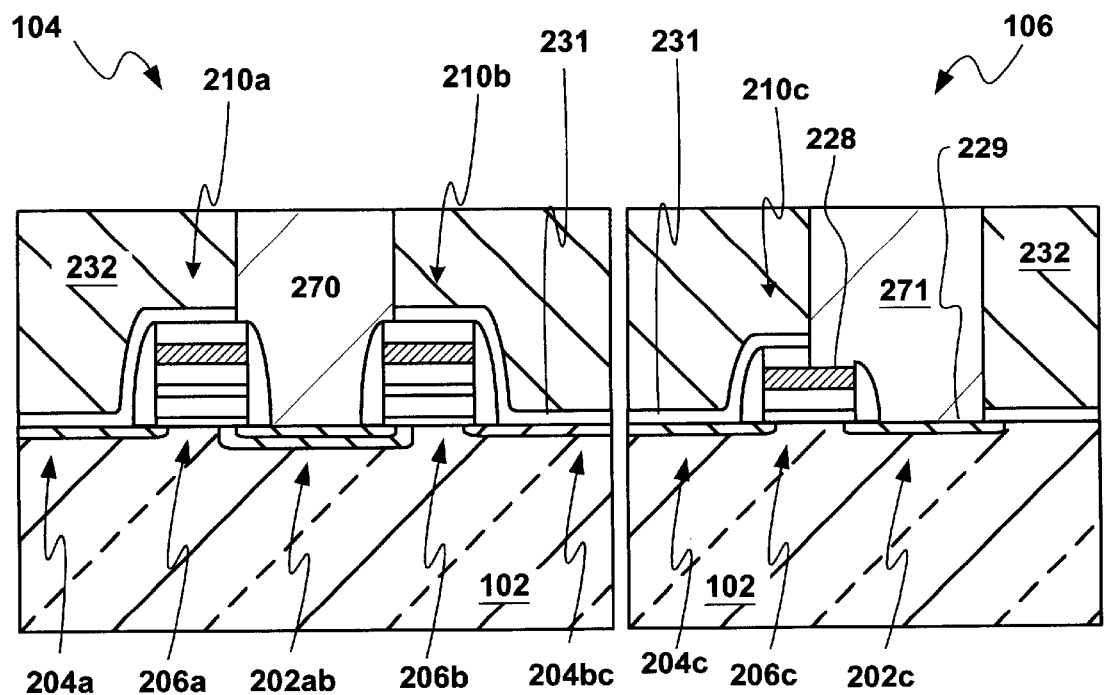

FIG. 4F shows the removal and planarization of the conductive material above the dielectric layer 232 using, for example, a chemical-mechanical planarization technique. The conductive material is planarized until it is planar with the top surface of the dielectric layer 232. This forms the S/D contact 270 and the LI contact 271. It will be noted that the LI contact 271 conductively connects the S/D silicide 229 and the gate silicide layer 224.

Therefore, by using self-aligned gate local interconnects in the peripheral region 106, and decoupling the processing between the core region 104 and the peripheral region 106, the effective spacing between adjacent multi-layer stacked gate structures 210a and 210b can be significantly reduced. Even further, conductive contact is assured by the LI contact 271 between the S/D silicide 229 and the gate silicide layer 224 in the peripheral region 106.

It will be understood that in other regions, the contacts may be made in the same fashion to form either source/drain contacts or local interconnects as desired. In production, a plurality of multi-layer stacked gate structures is formed on a semiconductor substrate 102 using conventional techniques as shown in FIG. 4A. A number are formed in the core region 104 and a number are formed in the peripheral region 106. A common source region 202ab is formed between the two multi-layer stacked gate structures 210a and 210b. Drain regions 204a and 204bc are formed on the semiconductor substrate 102 and are spaced apart from the common source region 202ab by channel regions 206a and 206b, respectively. Sidewall spacers 230 are formed around the multi-layer stacked gate structures 210a and 210b. The sidewall spacers 230 are formed using conventional deposition and etching techniques.

In this embodiment, each of the multi-layer stacked gate structures 210a and 210b includes the gate dielectric layer 212; the floating gate 214 disposed on the gate dielectric layer 212; the interpoly (inter-gate) dielectric layer 216 disposed on the floating gate 214; the control gate 218 overlying the interpoly dielectric layer 216, the gate silicide layer 224 disposed on the control gate 218; and a cap layer 228 of silicon oxynitride deposited on the gate silicide layer 224.

Next, an etch stop layer, such as the etch stop layer 231, is formed over the entire semiconductor substrate 102, including the multi-layer stacked gate structures 210a and 210b, sidewall spacers 230, common source region 202ab, and drain regions 204a and 204bc, using high temperature oxidation or plasma enhanced chemical vapor deposition (PECVD) (FIG. 4A). The deposition of the etch stop layer 231 is followed by the deposition of the dielectric layer 232 over and in contact with the etch stop layer 231. In one embodiment, the dielectric layer 232 includes boro-phospho-tetra-ethyl-ortho silicate (BPTEOS) or borophosphosilicate glass (BPSG), formed using plasma enhanced chemical vapor deposition (PECVD).

Next, the S/D contact opening 262 and the LI contact opening 263 are formed in the dielectric layer 232 using the contact mask 266 as a mask to expose portions of the common source region 202ab, as shown in FIG. 4B. The contact mask 266 is typically formed of a photoresist material. As explained above, an oxide etch process with high selectivity is used to form the S/D contact opening 262 and to minimize etching of the sidewall spacers 230 and the semiconductor substrate 102. It should be noted that the etch stop layer 231 located above the common source region 202ab and portions of the etch stop layer 231 on the sidewall spacers 230 are also removed during this etch process.

Thereafter the contact mask 266 is removed using a conventional photoresist stripping technique followed by a second deposition of photoresist to form the second contact mask 268 as shown in FIG. 4C. The second contact mask 268 is then patterned, photolithographically processed, and developed to provide an opening through which an anisotropic etch is used to form the local interconnect gate contact opening 265. During this process, the core region 104 is covered by the second contact mask 268 and is decoupled from the processing, or etching, of the peripheral region 106 as shown in FIG. 4D.

The second contact mask 268 is then removed using a conventional photoresist stripping technique.

The S/D contact opening 262 and the LI contact opening 263 then have a conductive material deposited in them and over the dielectric layer 232 to form the conductive layer 269. The conductive material fills the S/D contact opening 262, which will form the S/D contact 270, and the LI contact opening 263, which will form the LI contact 271 as shown in FIG. 4E. In one embodiment, the conductive material is tungsten and is formed using conventional metal deposition techniques.

After the formation of the S/D contact 270 and the LI contact 271, conductive material above the dielectric layer 232 is removed using for example, CMP, as shown in FIG. 4F.

Therefore, the present invention provides a method for shrinking a semiconductor device. By eliminating an etch stop layer, the multi-layer stacked gate structures 210a and 210b can be positioned closer together which permits the shrinking of the semiconductor device.

While the best mode utilizes tungsten as the conductive material for filling contact openings, it should be understood that the present invention is applicable to other materials selected from a group consisting of tantalum, titanium, copper, aluminum, gold, silver, alloys thereof, polysilicon, and compounds thereof.

Further, the processing for forming the LI contact 271 can be decoupled from the processing for forming the S/D contact 270.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor device on a semiconductor substrate, comprising the steps of:

forming a plurality of multi-layer structures on the semiconductor substrate to form core and peripheral regions, the plurality of multi-layer structures including local interconnect gate contacts;

forming sidewall spacers around the plurality of the multi-layer structures;

forming source and drain regions in the semiconductor substrate adjacent the sidewall spacers;

forming a stop layer over the semiconductor substrate, including the plurality of multi-layer structures, the sidewall spacers, and the source and drain regions;

forming a dielectric layer over the stop layer, depositing a first contact mask over the dielectric layer;

processing the first contact mask over the core and peripheral regions to expose portions of the dielectric layer;

removing portions of the dielectric layer and portions of the stop layer to expose the semiconductor substrate between the plurality of multi-layer structures and portions of the plurality of multi-layer structures in the core and peripheral regions to form core and peripheral contact openings;

removing the first contact mask;

depositing a second contact mask over the dielectric layer and in the core and peripheral contact openings;

processing the second contact mask to reopen portions of the multi-layer structures and the peripheral contact openings in the peripheral region and to cover the multi-layer structures in the core region;

removing portions of the multi-layer structures in the peripheral region using the second contact mask to expose the local interconnect gate contacts;

removing the second contact mask;

depositing a conductive material over the dielectric layer and in the core and peripheral contact openings; and removing the conductive material over the dielectric layer whereby the conductive material is left isolated in the core and peripheral contact openings to respectively form core contacts and peripheral local interconnects.

2. The method as claimed in claim 1 wherein the step of removing portions of the dielectric layer using the first contact mask to form the core contact openings is simultaneous with the step of removing portions of the dielectric layer to form the peripheral contact openings and the step of removing portions of the multi-layer structure using the second contact mask to form the gate contact openings is only performed in the peripheral contact openings whereby the forming of the core contacts and the peripheral local interconnects is decoupled.

3. The method as claimed in claim 1 wherein the steps of:

forming a plurality of multi-layer structures includes forming a floating gate, an inter-gate dielectric disposed on the floating gate, a control gate disposed on the inter-gate dielectric, and a silicide on the control gate;

forming source and drain regions includes forming silicides on the source and drain regions; and depositing a conductive material over the dielectric layer includes depositing the conductive material in contact with the silicides on the source and drain regions in the core region and in contact with the silicides on the control gate and the source and drain regions in the peripheral region.

4. The method as claimed in claim 1 wherein the step of removing portions of the dielectric layer and portions of the stop layer to expose the multi-layer structures in the peripheral region to form gate contact openings using the second contact mask uses an anisotropic removal process.

5. The method as claimed in claim 1 wherein the steps of depositing the contact mask and the second contact mask use a photoresist.

6. The method as claimed in claim 1 wherein the step of forming sidewall spacers includes depositing a spacer material layer over the multi-layer structures and the semiconductor substrate and isotropically removing the spacer material layer to form the sidewall spacers.

7. The method as claimed in claim 1 wherein the step of forming sidewall spacers uses a sidewall spacer of a material selected from a group consisting of a nitride, an oxide, an oxynitride, and a combination thereof.

8. The method as claimed in claim 1 wherein the step of forming the stop layer uses a material selected from a group consisting of a nitride, an oxide, an oxynitride, and a combination thereof.

9. The method as claimed in claim 1 wherein the steps of removing portions of the dielectric layer removes portions of the stop layer over portions of the plurality of multilayer structures, the sidewall spacers, and the source and drain regions.

10. The method as claimed in claim 1 wherein the step of depositing a dielectric layer uses an oxide.

11. A method of manufacturing a semiconductor device on a semiconductor substrate, comprising the steps of:

forming a plurality of multi-layer structures on the semiconductor substrate to form core and peripheral regions, the plurality of multi-layer structures including local interconnect gate contacts;

forming sidewall spacers around the plurality of the multi-layer structures;

forming source and drain regions by ion implantation into the semiconductor substrate adjacent the sidewall spacers;

depositing a etch stop layer over the semiconductor substrate, including the plurality of multi-layer structures, the sidewall spacers, the source and drain regions;

depositing a dielectric layer over the etch stop layer, depositing a first photoresist contact mask over the dielectric layer;

photolithographically processing the first photoresist contact mask to expose portions of the dielectric layer over the core and peripheral regions;

anisotropically etching portions of the dielectric layer and portions of the etch stop layer using the photoresist contact mask to expose the semiconductor substrate between the plurality of multi-layer structures and portions of the plurality of multi-layer structures in the core and peripheral regions to form core contact and peripheral local interconnect openings;

removing the first photoresist contact mask;

depositing a second photoresist contact mask over the dielectric layer and in the core contact and local interconnect openings;

photolithographically processing the second photoresist contact mask to reopen the peripheral local interconnect openings and expose portions of the multi-layer structures and the peripheral contact openings in the peripheral region and to cover the multi-layer structures in the core region;

anisotropically etching portions of the peripheral multi-layer structures using the second photoresist contact mask to expose the local interconnect gate contacts;

removing the second photoresist contact mask;

depositing a conductive material over the dielectric layer and in the core contact and peripheral local interconnect openings; and chemical mechanical polishing the conductive material over the dielectric layer whereby the conductive material is left isolated in the core contact and peripheral local interconnect openings to respectively form core and local interconnect contacts.

12. The method as claimed in claim 11 wherein the step of etching portions of the dielectric layer to form the core contact openings is simultaneous with the step of etching portions of the dielectric layer to form the peripheral local interconnect openings and the step of etching portions of the multi-layer structure using the second contact mask to form the gate contact openings is only performed in the peripheral contact openings whereby the forming of the core contacts and the peripheral local interconnects is decoupled.

13. The method as claimed in claim 11 wherein the steps of:

forming a plurality of multi-layer structures includes forming a floating gate, an inter-gate dielectric disposed on the floating gate, a control gate disposed on the inter-gate dielectric, the gate contact including a silicide over the control gate, and a passivation layer over the gate contact;

forming source and drain regions include forming silicide on the source and drain regions;

anisotropically etching portions of the dielectric layer and portions of the etch stop layer using the second photoresist contact mask etches the passivation layer to expose the silicide over the control gate;

depositing a conductive material over the dielectric layer includes depositing the conductive material only in contact with the silicide on the source and drain regions in the core region whereby the control gate and the source and drain regions are conductively unconnected; and depositing a conductive material over the dielectric layer includes depositing the conductive material in contact with the silicide over the control gate and the silicide on the source and drain regions in the peripheral region whereby the control gate and the source and drain regions in the peripheral region are conductively connected.

14. The method as claimed in claim 11 wherein the step of forming a sidewall spacer includes depositing a spacer material layer over the multi-layer structures and the semiconductor substrate and isotropically etching the spacer material layer to form the sidewall spacer.

15. The method as claimed in claim 11 wherein the step of forming a sidewall spacer uses a sidewall spacer of a material selected from a group consisting of a nitride, an oxide, an oxynitride, and a combination thereof.

16. The method as claimed in claim 11 wherein the step of forming the etch stop layer uses a material selected from a group consisting of a nitride, an oxide, an oxynitride, and a combination thereof.

17. The method as claimed in claim 11 wherein the steps of anisotropically etching portions of the dielectric layer etches portions of the etch stop layer over portions of the plurality of multi-layer structures, the sidewall spacers, and the source and drain regions.

18. The method as claimed in claim 11 wherein the step of depositing a dielectric layer uses an oxide.

* * * * *